(12) United States Patent
Tutt et al.

(10) Patent No.: US 6,570,324 B1
(45) Date of Patent: May 27, 2003

(54) IMAGE DISPLAY DEVICE WITH ARRAY OF LENS-LETS

(75) Inventors: Lee W. Tutt, Webster, NY (US); Myron W. Culver, Rochester, NY (US); Mitchell S. Burberry, Webster, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 113 days.

(21) Appl. No.: 09/618,298

(22) Filed: Jul. 19, 2000

(51) Int. Cl.[7] .............................. H01J 1/62; H01J 63/04
(52) U.S. Cl. ..................... 313/500; 313/498; 313/111
(58) Field of Search ............................. 313/500, 498, 313/499, 501, 110, 111, 634

(56) References Cited

U.S. PATENT DOCUMENTS

| | | | | |
|---|---|---|---|---|
| 4,467,193 A | * | 8/1984 | Carroll | 250/216 |
| 4,578,615 A | * | 3/1986 | Genovese et al. | 313/497 |
| 4,703,219 A | * | 10/1987 | Mesquida | 313/111 |
| 4,769,292 A | | 9/1988 | Tang et al. | 428/690 |
| 4,804,253 A | * | 2/1989 | Stewart | 349/104 |
| 5,061,569 A | | 10/1991 | VanSlyke et al. | 428/457 |
| 5,442,252 A | * | 8/1995 | Golz | 313/111 |
| 5,680,186 A | | 10/1997 | Watanabe et al. | 349/95 |
| 5,757,124 A | | 5/1998 | Pope | 313/495 |
| 5,808,410 A | * | 9/1998 | Pinker et al. | 313/493 |
| 5,867,321 A | | 2/1999 | Nakama et al. | 359/619 |
| 5,907,162 A | * | 5/1999 | Maruyama | 257/98 |
| 6,133,687 A | * | 10/2000 | Clarke | 313/478 |
| 6,252,345 B1 | * | 6/2001 | Ito et al. | 313/461 |
| 6,275,254 B1 | * | 8/2001 | Beeteson et al. | 348/59 |

FOREIGN PATENT DOCUMENTS

| | | |
|---|---|---|
| EP | 0615150 A3 | 9/1994 |
| EP | 0384849 B1 | 10/1994 |
| EP | 0640850 A2 | 3/1995 |
| EP | 0658779 A2 | 6/1995 |
| EP | 0744778 B1 | 7/1998 |
| EP | 0957385 A1 | 11/1999 |

\* cited by examiner

*Primary Examiner*—Vip Patel
*Assistant Examiner*—Kevin Quarterman
(74) *Attorney, Agent, or Firm*—Thomas H. Close

(57) ABSTRACT

An image display device includes a substrate; a sparse array of light emitting elements formed on one side of the transparent substrate, the light emitting element being selectively addressable to form an image; an array of lens-lets located on the opposite side of the substrate, the focal plane of the lens-lets being at the one side of the substrate and the lens-lets being arranged with respect to the light emitting elements such that the light emitted by the light emitting elements is directed by the respective lens-lets to intersect at a common region associated with a predetermined viewing distance; and the sparseness of the array of the light emitting elements being such that the ratio of the light emitting area of the light-emitting element under a lens-let to the total area of the lens-let is less than or equal to 0.25.

10 Claims, 2 Drawing Sheets

IMAGE DISPLAY DEVICE WITH ARRAY OF LENS-LETS

FIELD OF THE INVENTION

The present invention relates to display devices with integrated beam forming lens-lets or micro-lenses. More particularly, the present invention relates to the use of solid state emissive display devices with small lenses placed on or integrated into the display device substrate and associated with each light emitting element or sub-element.

BACKGROUND OF THE INVENTION

Digital imaging devices are widely known and used in electronic equipment. Solid-state imaging devices, those which are constructed on a substrate which may contain integrated drive circuitry, are very useful for portable imaging applications in which a light, rugged, high-quality display is needed. Such devices often rely on liquid crystal displays or light emitting diodes. In particular, organic light emitting diodes (OLEDs) provide a very thin, high-quality, and low-power technology for color image display with Lambertian emission characteristics providing a wide viewing angle. The OLED technology can be built upon a glass substrate as well as traditional silicon wafers.

Such displays, in general, are capable of reproducing images by writing specific information to a plurality of light emitting elements on a surface. These light emitting elements are generally organized as a rectangular array and are addressed via control lines connected to the display device. Each light emitting element is individually addressable and specific data values representing an amount of light to be produced, can be written to them; each data value then being expressed as an element in the displayed image. For color displays, each light emitting element is generally composed of sub-elements in each of several, usually three, primary colors—typically red, green, and blue. Since the sub-elements are so small, a human observer will see the additive combination of the primary colors enabling the display of many different colors. Each of these sub-elements elements is individually addressable by the control and data lines of the display device.

Optical technology has now progressed to the point that very small optical elements can be created. These elements can be fabricated in a variety of ways and can be combined into an array of small elements covering a surface. Each lens element affects the light passing through according to that element's surface profile and its refractive index. The lens element is referred to as a lens-let, micro-lens-let, or micro-lens or in the case of periodic cylindrical lenses: lenticular arrays. This technique of optical design differs from the traditional in that different portions of a beam can be made to pass through different optical elements, enabling a variety of effects. The construction of the lens-lets on a surface also enables the implementation of optical effects using smaller optical elements because each lens-let is very small and the surface on which they are made can be very thin and light-weight. It is also the case that construction techniques for lens-let arrays has progressed to the point that such arrays are well understood and manufacturable (see U.S. Pat. No. 5,867,321, issued Feb. 2, 1999 to Nakama et al., entitled Planar Microlens Array and Method of Making Same). Hence, thin, robust, imaging systems with a wide variety of properties can be created using this technology.

Digital imaging displays have been integrated with micro-lens technology to improve the optical characteristics of the display. Most such implementations rely on laminating a micro-lens array on the surface of a display device. In particular, some liquid crystal display devices include a micro-lens layer to shape the light entering and exiting from each light emitting element in the display so as to improve the viewing angle of the display or otherwise enhance the display characteristics (see EP 0 640 850 A2, published Mac. 1, 1995, Suzuki et al., entitled Microlens Array Sheet for a Liquid Crystal Display, Method for Attaching the Same and Liquid Crystal Display Equipped with the Same; U.S. Pat. No. 5,680,186, issued Oct. 21, 1997 to Watanabe et al., entitled Liquid Crystal Display Device with Microlenses Having a Focal Point Between a Cover Layer and the Liquid Crystal Layer's Center; and EP 0 615 150 A3 and A2, published Sep. 9, 1994, Borrelli et al., entitled Cover Glass for LCD Panel). It is also possible to integrate a micro-lens directly upon a substrate of display light emitting elements with the use of resins to form the lenses (see EP 0 658 779 A2, published Jun. 21, 1995, Mizuguchi et al., entitled Microlens Substrate). In the first case, a separate substrate or layer must be incorporated into the device, adding manufacturing cost and difficulty. In the second case, the integration of resin materials on a substrate is problematic from both a materials and process perspective. In both cases, the designs are for liquid crystal devices.

Other integrations of light emitting devices and micro-lenses have also been explored. For example, EP 0 384 849 B1, published Aug. 29, 1980, Shimada et al., entitled A Semiconductor Light Emitting System describes an LED with an integrated micro-lens on the same substrate which radiates parallel to the substrate. Such designs are not suitable for a multi-element display device and require complex photolithography techniques. Micro-lenses are also used in conjunction with solid-state light capturing devices (see EP 0 744 778B1, published Nov. 27, 1996, Sano et al., entitled Solid-State Imaging Device and Method of Manufacturing the Same) and in light-valve displays (U.S. Pat. No. 5,757,124, issued May 26, 1998 to E. Pope, entitled Display Screen Having Amorphous Silica Microspheres with Fluorescence Behavior) using masks and microspheres. Cathode ray tubes with a layer of light emitting element level optical micro-lenses are also known (EP 0 957 385 A1, published Nov. 17, 1999, S. Zelitt, entitled 3-D Imaging System) in this case to support three-dimensional (3-D) imaging.

These techniques rely on the use of an additional surface with micro-lenses attached to the surface of a digital image display, the use of a special cover material surface with micro-lenses encapsulating the display, or special process methods to integrate micro-lenses on the base substrate. In the first case, additional materials, components, and process steps are needed to fabricate a solid-state display with micro-optical components. In the second case an existing component must be specially treated and aligned with the other components and, in the third case, difficult materials and non-standard process methodologies must be undertaken which limits the use of the technique. Moreover, many of these methods are limited in application to liquid crystal display devices.

Hence, digital image display systems that are portable, small, and lightweight, are greatly restricted in their ability to integrate optical elements for producing desirable effects. When added to an imaging system, the optical elements are too bulky, lack robustness, or require manufacturing methods and precision, which adds to the cost of the system.

In standard emissive OLED devices the energy is emitted uniformly in all directions. This is an advantage over LCD displays, which are more directional. The disadvantage of this uniform angular emission is that much energy is used for directions that, in many applications, are not useful. It would be desirable to direct the emission directly at the user and spare the energy currently employed away from the user. Another advantage for this would be for security so that other users could not view the screen.

There is a need therefore to provide an improved display that directs the energy to an observer and spares the energy required to transmit to regions away from the viewer.

SUMMARY OF THE INVENTION

The need is met according to the present invention by providing an image display device that includes a substrate; a sparse array of light emitting elements formed on one side of the transparent substrate, the light emitting element being selectively addressable to form an image; an array of lens-lets located on the opposite side of the substrate, the focal plane of the lens-lets being at the one side of the substrate and the lens-lets being arranged with respect to the light emitting elements such that the light emitted by the light emitting elements is directed by the respective lens-lets to intersect at a common region associated with a predetermined viewing distance; and the sparseness of the array of the light emitting elements being such that the ratio of the light emitting area of the light-emitting element under a lens-let to the total area of the lens-let is less than or equal to 0.25.

The present invention has the advantage of providing a low-cost, small, and energy efficient display. Another advantage is that the viewer of the display has improved privacy for the subject matter being viewed.

DETAILED DESCRIPTION OF THE INVENTION

The foregoing problems associated with the use of solid-state digital imaging devices can be overcome by integrating lens-let or lenticular arrays directly into the transparent substrate of an OLED display device and associating each lens-let with a display device element.

Figure 1:
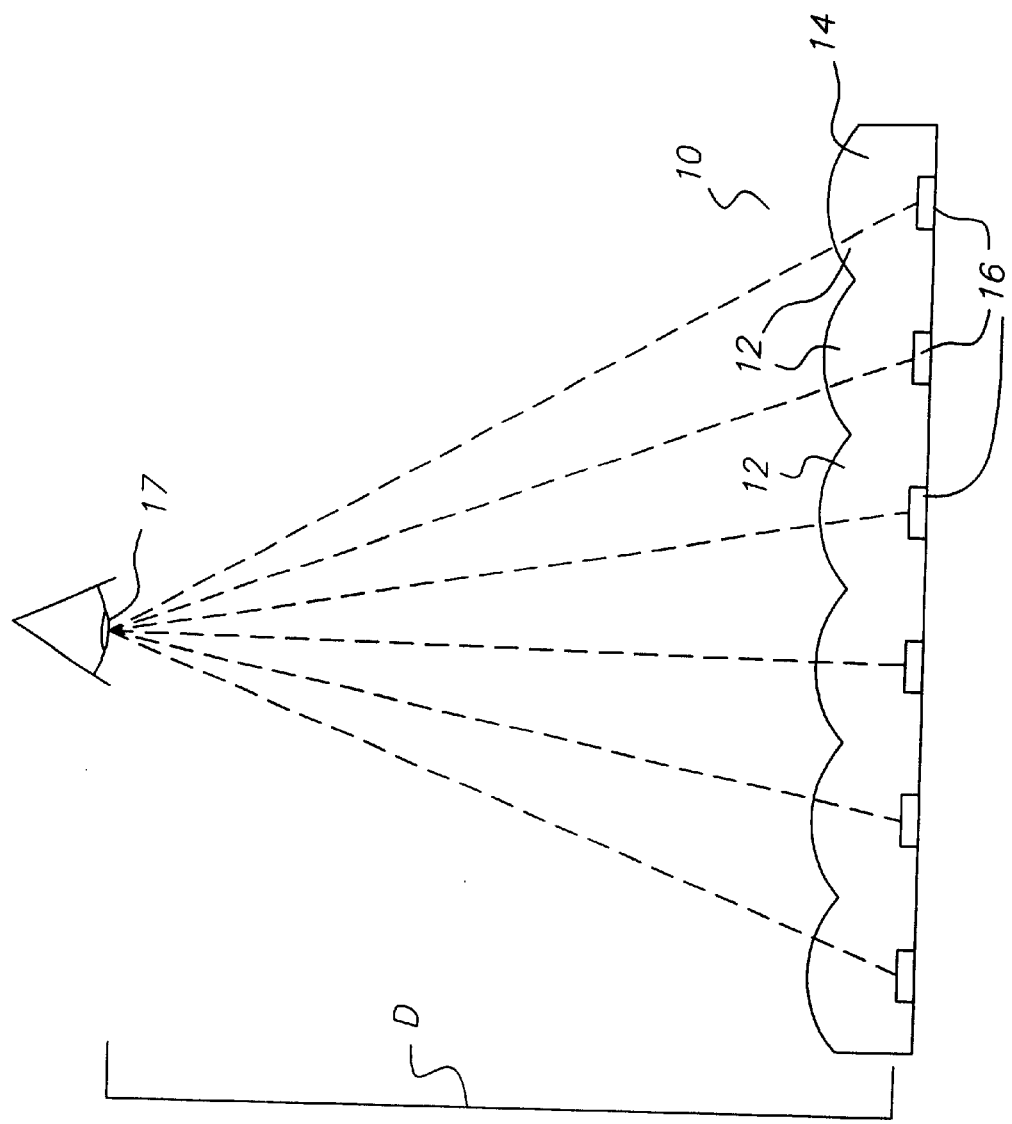
FIG. 1 is a cross section of a display device with a lens-let array attached to the viewable side of the display.

Referring to FIG. 1, the device 10 is constructed as follows. First, a glass or plastic lens-let array 12 is formed on one side of a glass (or other suitable transparent material) substrate 14. The other side of the substrate 14 is prepared appropriately for the deposition of materials needed to create an OLED digital imaging device, which emits through the substrate. The glass substrate 14 is then used as the substrate for a conventional image display device with OLED light emitting elements 16. Care must be taken to align the lens-lets 12 with the light emitting elements 16 in the display.

The size of the light emitting elements and their placement is critical for efficient transfer of radiation to the viewer. For a lenticular optical array, which is an array of cylindrical lens and therefore only has optical power on one axis, (the lenses run in the same direction as the eye axis). In this orientation each eye sees the same image. The lenses are constructed such that the focal point is on the light emmitting element (i.e. the focal plane of the lend-let is the other surface of the subsrate). The light emitting element height is then chosen based on the F/# such that the viewer can easily see the image when correctly oriented but not off-axis. In FIG. 1, the angle which the image can be seen is the viewing angle. All the power that would have gone into the off axis radiation is therefore saved. Care must also be taken such that the light emitting element pitch is close to the pitch of the lenses but slightly larger. If the pitch of the light emitting elements is identical, the image could only be viewed properly infinitely far away. By increasing the pitch of the light emitting elements relative to the pitch of the lenses,the proper viewing distance can be moved closer to a distance appropriate to the application. FIG. 1 shows the placement of light emitting elements is directed by the respective lens-lets to intersect at a common region 17 associated with a predetermind viewing distance D.

Figure 2:
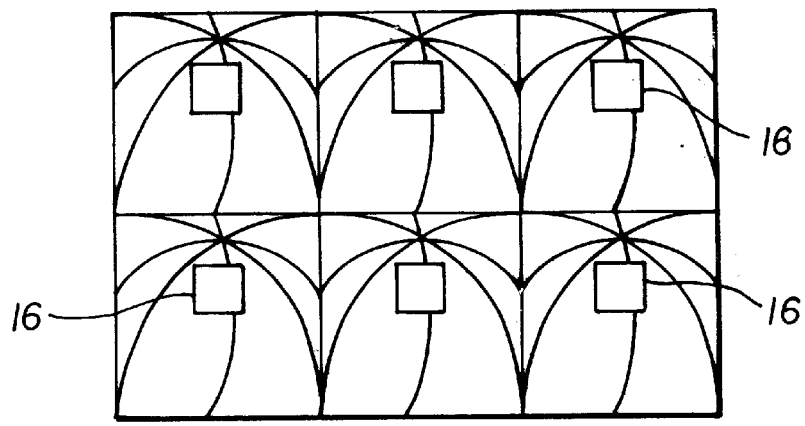
FIG. 2 is a to view showing a pattern of light emitting elements and an associated lens-let array.

The active emitting region (light emitting element 16) should be a small percentage of the available region under a lens (see FIGS. 1 and 2). For a lens-let, if the active region is half the width and height of a lens, then the area will be 25%. Since the power for the emission scales as the area then only 25% power will be necessary. This savings in power is not at the cost of brightness, instead it is at the cost of viewing angle and distance. The non-emitting areas can also serve as regions for any active electronics, if desired. For many applications such as PDAs and video cameras, the view is direct and the viewing distance is approximately constant thereby allowing efficient power use. Thus, the sparseness of the array of the light emitting elements is such that the ratio of the light emitting area of the light-emitting element under a lens-let to the total area of the lens-let is less than or equal to 0.25.

For lens-let arrays of spherical lens-lets, the same considerations as for lenticular arrays must be taken into account, plus the additional condition of needing to give both eyes the same image. The light emitting element size can not be reduced beyond the point at which dual eye coverage occurs in the eye axis direction. This size limitation will be dependent on the F/# of the lens-lets and the viewing distance.

Figure 3:
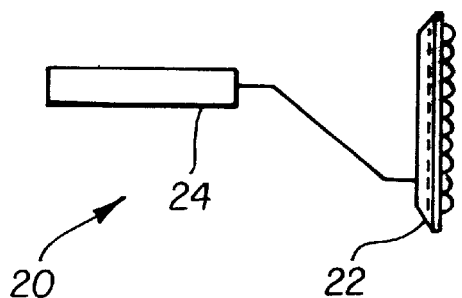
FIG. 3 is a schematic diagram showing an electronic device powering a lens-let display according to the present invention.
Figure 4:
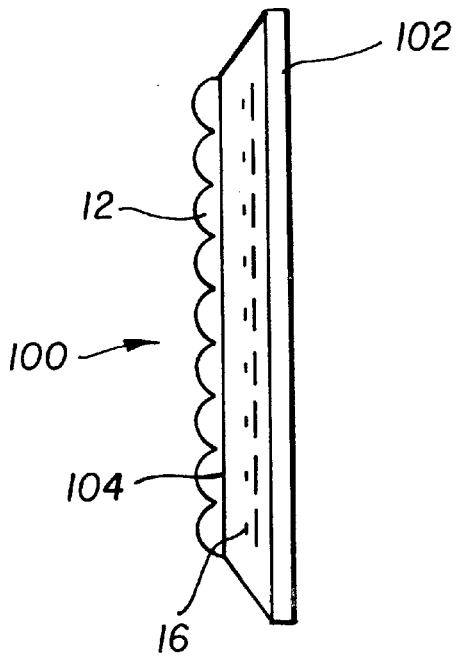
FIG. 4 is a schematic diagram showing a lens-let display with a transparent cover with lens-lets.

Once the elements are deposited on the substrate and appropriately encapsulated, optical coatings can be applied to the lens-lets. FIG. 3 illustrates an appropriate controlling system 20 wherein the device 22 is connected to a source of image data and control electronics 24 and the system is ready for use.

The glass lens-let array can have a separate, singular lens-let array for each sub-element (i.e. for every color element of each light emitting element) or have a single element for each light emitting element or group of elements. Note that any materials necessary to the construction of the display device that are placed between the light-emitting elements and the transparent substrate must also be transparent. Such materials, such as contacts made of indium tin oxides, are well known in the art.

It is also possible to construct a similar device similar to that of EP 0 615 150 A3 by using a non-transparent substrate with a transparent cover (FIG. 5). In this case the display device 100 is built first upon the non-transparent substrate 102 with display light emitting elements 16 and then encapsulated with a transparent cover 104. The side of the cover opposite the display materials and substrate must have formed upon it the lens-lets 12. When encapsulating the device, the cover must be carefully aligned to ensure that the lens-let elements are properly aligned with the light emitting elements.

It is also possible to use substrate materials other than glass. The only restriction is that the display device materials may be suitably deposited on the substrate. As long as deposition is possible on one side of the substrate material and the material is suitable for the manufacturing process, any substrate material capable of forming lens-lets on the opposite side and transparent to the emitted light may be used.

This invention can also be practiced by carefully affixing a lens-let array to the substrate on the side opposite the light-emitting materials. The array must be aligned to the substrate so that each lens-let is associated with the particular light emitting elements(s) intended and so that no unnecessary interference will degrade the optical quality of the system.

Although the invention is described with reference to use of organic light emitting diode technology, any display technology which can be built upon a transparent substrate capable of forming lens-lets so long as the light from the display can travel through the substrate and lens-lets.

In a preferred embodiment, the invention is employed in an emissive display that includes Organic Light Emitting Diodes (OLEDs) which are composed of small molecule polymeric OLEDs as disclosed in but not limited to U.S. Pat. No. 4,769,292, issued Sep. 6, 1988 to Tang et al., entitled Electroluminescent Device with Modified Thin Film Luminescent Zone and U.S. Pat. No. 5,061,569, issued Oct. 29, 1991 to VanSlyke et al., entitled Electroluminescent Device with Organic Electroluminescent Medium. This technology provides a platform on which an integrated imaging platform with a transparent substrate can be constructed. Many combinations and variations of OLED materials can be used to fabricate such a device, and are included in this invention. The deposited silicon materials may be single-crystal in nature or be amorphous, polycrystalline, or continuous grain. These deposited materials and substrates are known in the prior art and this invention may be applied equally to any microcircuit integrated on a suitable substrate.

A solid state display device with an integrated lens-let array provides a to combine optical elements with a high-quality display device and lower the power requirements necessary. Because both the lens-lets and the display devices are readily manufactured using standard processes and placed on opposite sides of the same surface, an extremely low power, thin, lightweight imaging device supporting a wide variety of optical effects can be made at low cost.

The invention has been described in detail with particular reference to certain preferred embodiments thereof, but it will be understood that variations and modifications can be effected within the spirit and scope of the invention.

PARTS LIST

10 device
12 lens-let array
14 substrate
16 light emitting elements
20 controlling system
22 device
24 control electronics
100 display device
102 non transparent substrate
104 transparent cover

What is claimed is:

1. An image display device comprising:
   a) a transparent substrate;
   b) a sparse array of light emitting elements formed on one side of the transparent substrate, the light emitting element being selectively addressable to form an image;
   c) an array of lens-lets located on the opposite side of the substrate, the focal plane of the lens-lets being at the one side of the substrate and the lens-lets being arranged with respect to the light emitting elements such that the light emitted by the light emitting elements is directed by the respective lens-lets to intersect at a common region associated with a predetermined viewing distance; and
   d) the sparseness of the array of the light emitting elements being such that the ratio of the light emitting area of the light-emitting element under a lens-let to the total area of the lens-let is less than or equal to 0.25.

2. The image display device claimed in claim 1 where the substrate is glass.

3. The image display device claimed in claim 1 where the substrate is plastic.

4. The image display device claimed in claim 1 wherein the lens-lets are cylindrical lens-lets and the light emitting elements are spaced apart greater in a direction perpendicular to the cylindrical axes of the lens-lets.

5. The image display device claimed in claim 1 wherein the lens-lets are spherical lens-lets.

6. The image display device claimed in claim 1, wherein the light emitting elements are OLEDs.

7. The image display device claimed in claim 1, wherein the lens-let array is formed integrally with the substrate.

8. The image display device claimed in claim 1, wherein the lens-let array is formed separate from and attached to the substrate.

9. The image display device claimed in claim 1, wherein the display device is a color display and each light emitting element includes a plurality of differently colored light emitters.

10. The image display device claimed in claim 1, wherein the display device is a color display and each light emitting element emits a single color of light and different light emitting elements emit differently colored light.

\* \* \* \* \*